United States Patent
Lell

(10) Patent No.: US 6,339,233 B1
(45) Date of Patent: *Jan. 15, 2002

(54) METAL CLAD RIDGE WAVEGUIDE ("MCRW") LASER SEMICONDUCTOR STRUCTURE WITH DOPED SEMICONDUCTOR SUBSTRATE

(75) Inventor: Alfred Lell, Maxhuette-Haidhof (DE)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/940,600

(22) Filed: Sep. 30, 1997

(30) Foreign Application Priority Data

Sep. 27, 1996 (DE) .......................... 196 40 003

(51) Int. Cl.⁷ ..................... H01L 31/0328; H01L 33/00; H01L 31/00
(52) U.S. Cl. .......................... 257/195; 257/88; 257/94; 257/93; 257/446
(58) Field of Search .............................. 257/94, 88, 93, 257/96, 97, 431, 443, 446, 275, 184, 195, 197

(56) References Cited

U.S. PATENT DOCUMENTS

| 4,211,941 A | | 7/1980 | Schade, Jr. .................. 257/104 |
| 4,697,202 A | | 8/1987 | Sher ............................ 257/614 |
| 5,087,579 A | | 2/1992 | Tomassetti ................... 438/208 |
| 5,107,319 A | * | 4/1992 | Lauterbach et al. ......... 257/195 |
| 5,266,831 A | | 11/1993 | Phipps et al. ............... 257/620 |

FOREIGN PATENT DOCUMENTS

| JP | 55015624 | 2/1980 | .................. 257/798 |
| JP | 57027094 | 2/1982 | .................. 257/94 |

OTHER PUBLICATIONS

"Reduced backgating effect in modulation–doped field–effect transistors by p–n junction isolation" (Patil et al.), Dec. 12, 1988, vol. 53, No. 24, pp. 2417–2419;.
"Monolithic integratin of InGaAsP/InP laser diode with heterojunction bipolar transistors" (Shibata et al.), 16$^{th}$ Intern. Conference on solid state devices and materials, dated Aug. 30, 1984—Sep. 1, 1984, pp. 129–132;.
"n–p–(p⁺–n⁺)–n $Al_yGa_{1-y}As$–GaAs–$In_xGa_{1-x}As$ quantum–well laser with p⁺–n⁺GaAs–InGaAs tunnel contact on n–GaAs", Applied Physics Letters, dated May 17, 1993, vol. 62, No. 20, pp. 2510–2512;.
"Fabrication and Characteristics of MCRW GaAs/GaAlAs Lasers on Semiinsulating Substrate" (G. Müller et al.), Journal of Optical Communications 6, 1985, pp. 42–43.
"Reduced Backgating Effect in Modulation–Doped Field–Effect Transistors by p–n Junction Isolation" (Patil et al.), Appl., Phys. Lett. 53, Dec. 1988, pp. 2417–2419;.
"Monolithic Planar Led Arrays by one Diffusion Step" (Blum et al.), IBM Technical Disclosure Bulletin, vol. 14, No. 6, Nov. 1971, p. 1808;.
"Nasa Patter" (Harris), Applied Optics, vol. 27, No. 15, Aug. 1988.

\* cited by examiner

Primary Examiner—Steven Loke
(74) Attorney, Agent, or Firm—Herbert L. Lerner; Laurence A. Greenberg; Werner H. Stemer

(57) ABSTRACT

A semiconductor device comprises an electrically conductive III-V semiconductor substrate which has mutually opposite first and second main surfaces. At least one pn junction, reverse biased during operation of the semiconductor device, is disposed above the first main surface. At least one functional semiconductor structure is disposed above the at least one pn junction. The functional semiconductor structure is electrically insulated from the second main surface of the III-V semiconductor substrate.

7 Claims, 1 Drawing Sheet

METAL CLAD RIDGE WAVEGUIDE ("MCRW") LASER SEMICONDUCTOR STRUCTURE WITH DOPED SEMICONDUCTOR SUBSTRATE

BACKGROUND OF THE INVENTION

FIELD OF THE INVENTION

The invention relates to a semiconductor device, in which at least one functional semiconductor structure is assigned to a first main surface of a III-V semiconductor substrate, and in which the functional semiconductor structure is electrically insulated from a second main surface of the III-V semiconductor substrate which is opposite the first main surface.

A semiconductor device of this type is, for example, disclosed by Franklin S. Harris, Jr., Applied Optics, Vol. 27, No. 15, page 3141. That article describes a photodiode array in which a multiplicity of AlGaAs/GaAs photodiodes are monolithically integrated on a so-called semi-insulating GaAs substrate.

In addition, G. Müller, M. Honsberg, Journal of Optical Communications 6 (1985), June No. 2, Berlin, Germany, page 42, discloses a Metal Clad Ridge Waveguide ("MCRW") laser structure which is applied to a semi-insulating GaAs substrate. The semi-insulating GaAs substrate is used to electrically insulate a plurality of monolithic integrated components from one another on the substrate. The insulating affect of semi-insulating substrates is achieved by incorporating low impurity levels into the substrates (for example Cr or C in the case of GaAs substrates, and Fe in the case of InP substrates). However, the incorporation of dopants of this type into a III-V crystal lattice entails a number of difficulties both in the production and in the handling of the lattice. It is thus, for example, very difficult to incorporate these dopants uniformly into the III-V crystal lattice and makes it considerably more difficult to produce a uniform insulation affect over the entire surface of a semi-insulating substrate. The production yield of semiconductor components having semi-insulating substrates is therefore very low, for example, in comparison with the production of semiconductor components on conductive GaAs substrates.

A further problem with the semi-insulating semiconductor substrates is the fact that their insulation effect is drastically reduced when experiencing a moderate increase in temperature because free charge carriers are produced in the semiconductor crystal.

SUMMARY OF THE INVENTION

It is accordingly an object of the invention to provide a semiconductor device and a process for the production of the device, which overcome the herein-mentioned disadvantages of the heretofore-known devices and methods of this general type, and which provides homogenous electrical insulation properties between the functional semiconductor structure disposed above the first main surface of a III-V semiconductor substrate and the second main surface of the III-V semiconductor substrate and which also provides an effective electrical insulation effect at high operating temperatures.

With the foregoing and other objects in view there is provided, in accordance with the invention, a semiconductor device, comprising an electrically conductive III-V semiconductor substrate having mutually opposite first and second main surfaces; at least one pn junction, reverse biased during operation of the semiconductor device, and disposed above the first main surface; and at least one functional semiconductor structure disposed above the at least one pn junction, the functional semiconductor structure being electrically insulated from the second main surface of the III-V semiconductor substrate.

According to the invention an electrically conductive III-V semiconductor substrate is provided and at least one pn junction, reverse biased during operation of the semiconductor device, is disposed between the functional semiconductor structure and the III-V semiconductor substrate. That has, in particular, the advantage of providing a conductive substrate which is substantially easier to produce and therefore more cost effective than prior art semi-insulating substrates which require a more elaborate production process. The pn junction which is reverse biased during operation undertakes the electrical insulation of the functional semiconductor structure from the second main surface of the III-V semiconductor substrate.

In accordance with an added feature of the invention, the electrically conductive III-V semiconductor substrate has a charge carrier concentration of more than $1*10^{15}$ cm-3 at room temperature.

In accordance with another feature of the invention, the electrically conductive III-V semiconductor substrate has a charge carrier concentration of between $1*10^{16}$ cm$^{-3}$ and $1*10^{19}$ cm$^{-3}$ at room temperature.

In a preferred embodiment of the semiconductor device according to the invention, the electrically conductive III-V semiconductor substrate has a charge carrier concentration of $>1 \cdot 10^{15}$ cm$^{-3}$ at room temperature (that is to say at about 20° C.). It is particularly advantageous if the electrically conductive III-V semiconductor substrate has a charge carrier concentration of between $1 \cdot 10^{16}$ cm$^{-3}$ and $1 \cdot 10^{19}$ cm$^{-3}$ at room temperature. III-V semiconductor substrates of this type are produced in large numbers for conventional III-V semiconductor components and are therefore available at low cost.

In accordance with an addition feature of the invention, the III-V semiconductor substrate has a first conduction type, and includes a first doped III-V semiconductor layer of a second conduction type disposed between the III-V semiconductor substrate of the first conduction type and the at least one functional semiconductor structure.

In accordance with yet another added feature of the invention, there is a second doped III-V semiconductor layer of the first conduction type disposed between the at least one functional semiconductor layer and the first doped III-V semiconductor layer in such a way that the III-V semiconductor substrate, the first doped II-V semiconductor layer and the second doped III-V semiconductor layers form the at least one pn junction disposed in opposite directions.

In an advantageous configuration of the semiconductor device according to the invention, a doped III-V semiconductor substrate of a first conduction type is provided. Applied to that is a first doped III-V semiconductor layer of a second conduction type, to which a second doped III-V semiconductor layer of the first conduction type is in turn applied. The functional semiconductor structure is arranged on the second doped III-V semiconductor layer. The III-V semiconductor substrate and the first and the second doped III-V semiconductor layers together form two pn junctions of opposite directions. With a layer sequence of this type, one of the two pn junctions is always reverse biased during operation, irrespective of the conduction type possessed by a semiconductor layer of the functional semiconductor structure applied to the second doped III-V semiconductor layer.

In yet another additional feature of the invention, the at least one functional semiconductor structure is an MCRW laser structure.

In accordance with yet another feature of the invention, there are photodiode structures having a photodiode array disposed on the at least one functional semiconductor structure.

In accordance with yet another added feature of the invention, the at least one functional semiconductor structures are at least two monolithically integrated functional semiconductor structures, and the at least one pn junction is disposed between each of the at least two monolithically functional semiconductor structures and the second main surface of the electrically conductive III-V semiconductor substrate.

In accordance with yet another additional feature of the invention, the at least one pn junction is cut in an intermediate location between two of the at least two monolithically integrated functional semiconductor structures in such a way that there is no conductive electrical connection between the at least two monolithically integrated functional semiconductor structures via the III-V semiconductor substrate and inclusive of at least one of the first doped III-V semiconductor layer and the second doped III-V semiconductor layer.

In accordance with a concomitant feature of the invention, the at least one functional semiconductor structure is at least two monolithic integrated functional semiconductor structures of different types.

In a further embodiment of the semiconductor device according to the invention, at least two monolithic integrated functional semiconductor structures are assigned to the electrically conductive III-V semiconductor substrate, and at least one pn junction which is reverse biased during operation of the semiconductor device is arranged between each of the functional semiconductor structures and the electrically conductive III-V semiconductor substrate. The pn junction, or the pn junctions is or are cut in an intermediate space between the functional semiconductor structures in such a way that there is no conductive electrical connection between the functional semiconductor structures via the III-V semiconductor substrate, where appropriate inclusive of one or more III-V semiconductor layers applied thereto. That is the case whenever the current path between two functional semiconductor structures would lead via a reverse biased pn junction. With a semiconductor device of this type, it is possible to produce in simple fashion an integrated circuit configuration of a multiplicity of III-V semiconductor components on a single III-V semiconductor substrate.

With the foregoing and other objects in view there is also provided, in accordance with the invention, a process for producing a semiconductor device, which comprises: a) producing a doped III-V semiconductor substrate of a first conduction type; b) applying a first doped III-V semiconductor layer of a second conduction type to the III-V semiconductor substrate; c) applying a second doped III-V semiconductor layer of the first conduction type to the first doped III-V semiconductor layer; d) applying an active layer system to the second doped III-V semiconductor layer; and e) producing at least two functional semiconductor structures electrically insulated from one another, by cutting the active layer system inclusive of the first and the second doped III-V semiconductor layers.

In a preferred process for producing a semiconductor device according to the invention, a first doped III-V semiconductor layer of the second conduction type is applied to a prefabricated doped III-V semiconductor substrate of the first conduction type. An active layer system of at least one functional semiconductor structure is then applied to the first doped III-V semiconductor layer or to a second doped III-V semiconductor layer of the first conduction type which is additionally applied to the first doped III-V semiconductor layer. After that, by cutting (for example etching through or sawing) the active layer system, inclusive of the first and, if appropriate, the second doped III-V semiconductor layers, at least two functional semiconductor structures are produced which are electrically insulated from one another. These can then be electrically connected to one another by providing contact metalizations and, if appropriate, be connected to further components arranged externally.

Other features which are considered as characteristic for the invention are set forth in the appended claims.

Although the invention is illustrated and described herein as embodied in semiconductor device and process for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
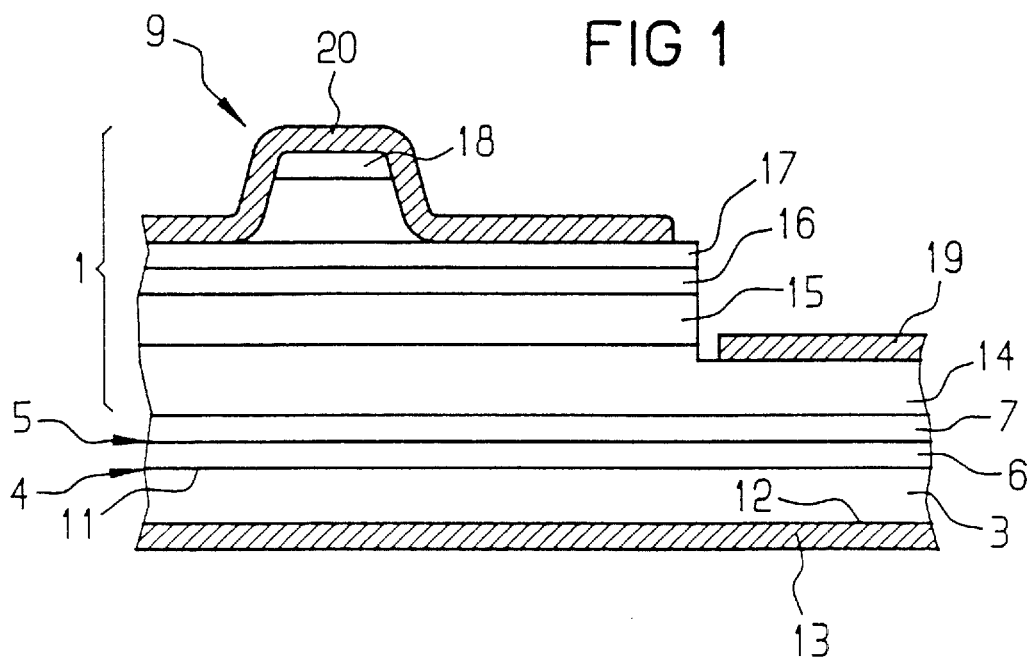
FIG. 1 is a diagrammatic, cross-sectional view of a first embodiment of the semiconductor device according to the invention.

Referring now to the figures of the drawing in detail and first, particularly, to FIG. 1 thereof, there is shown a functional semiconductor structure 1 which is an MCRW laser structure 9. The functional semiconductor structure 1 is applied to a layer sequence which is formed of a III-V semiconductor substrate 3. Applied to the III-V semiconductor substrate 3 is a first doped III-V semiconductor layer 6 to which a second doped III-V semiconductor layer 7 is in turn applied. The III-V semiconductor substrate 3 is, for example, produced from n doped GaAs, and the first 6 and second 7 doped III-V semiconductor layers are formed, for example, of p doped or n doped GaAs. The III-V semiconductor substrate 3 and the first 6 and second 7 doped III-V semiconductor layers form two pn junctions 4, 5 facing in opposite directions. A metalization layer 13 is applied to the second main surface 12 opposite a first main surface 11 of the III-V semiconductor substrate 3. The metalization layer, for example, can be formed of Cr/In. The metalization layer is, for example, used for soldering the semiconductor device to a heat sink made of copper. The dopants used for the III-V semiconductor substrate 3 and the first 6 and second 7 doped III-V semiconductor layers are, for example, the dopants customarily used in semiconductor technology for III-V semiconductor materials. These dopants will therefore not be explained in further detail at this point.

The functional semiconductor structure 1 of the MCRW laser structure 9 is applied to the second doped III-V semiconductor layer 7, for example by MOVPE or MBE. The functional semiconductor structure 1, for example, is formed of an n⁺ doped GaAs layer 14, an n doped GaAlAs layer 15, an active layer 16 of undoped GaAs or of an active layer sequence/system, a p doped GaAlAs layer 17 and a p⁺ doped GaAs layer 18. The n⁺ doped GaAs layer 14 is, for example, provided with an n contact 19, formed of AuGe/Ni/Au, and the p doped GaAlAs layer 17 as well as the n⁺ doped GaAs layer 18 are provided with a p contact metalization 20 which is formed of for example by Cr/Au, Cr/Pt/Au, Ti/Pt/Au or Ti/Au layer sequence. That is a usual MCRW laser structure, known to the person skilled in the art, which therefore needs no further explanation at this point.

Clearly, a plurality of MCRW laser structures 9, which are electrically insulated from one another, may be formed on the III-V semiconductor substrate 3 having the first 6 and the second 7 doped III-V semiconductor layer according to the first illustrative embodiment. The structure shows that the electrical insulation is provided through the substrate. The individual MCRW laser structures may naturally be connected with one another via metalization tracks.

Figure 2:
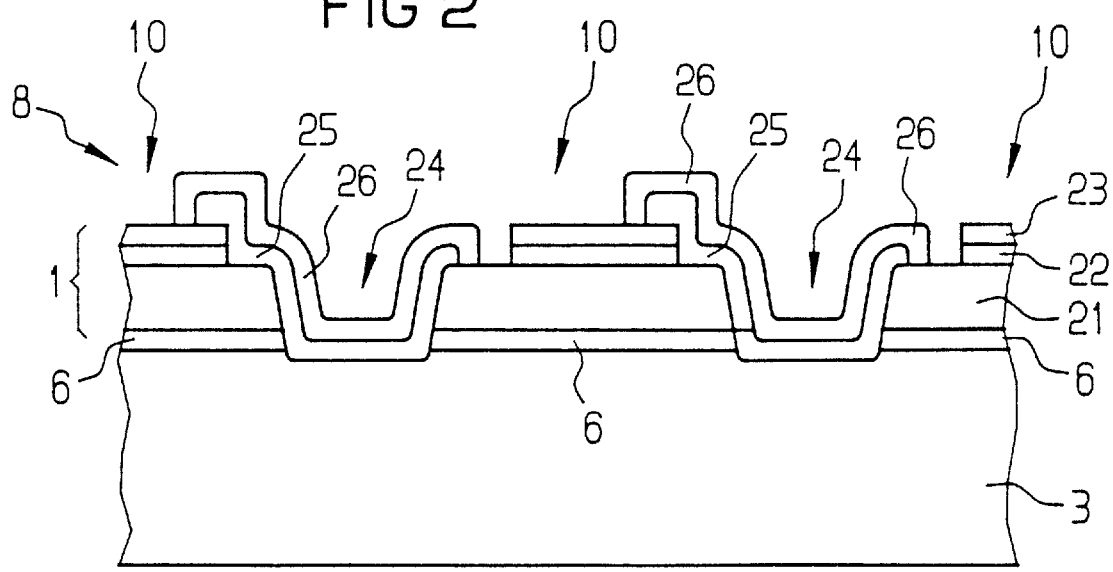
FIG. 2 is a diagrammatic, cross-sectional view of a second embodiment of a semiconductor device.

FIG. 2 represents an illustrative embodiment of a semiconductor device according to the invention, in which a multiplicity of photodiode structures 10 of a photodiode array 8 are applied to a single electrically conductive III-V semiconductor substrate 3 of the first conduction type. The first doped III-V semiconductor layer 6 of the second conduction type is in each case arranged between the photodiode structures 10 and the electrically conductive III-V semiconductor substrate 3 which, for example, can be formed of n doped GaAS. The semiconductor layer, for example, can be formed of p doped GaAs. Starting from the first doped III-V semiconductor layer 6, the photodiode structures 10 are in each case composed of an n doped GaAs layer 21, a p doped GaAs layer 22 and a p doped AlGaAs layer 23. The individual photodiode structures 10 are produced by cutting this layer sequence into multiple parts, inclusive of the first doped III-V semiconductor layer 6, along predetermined partition lines, for example, by the use of etching trenches 24. The insides of the etching trenches 24 are provided with an insulation layer 25, for example, an insulation layer of SiO₂, to which a metalization layer 26 via which the individual photodiode structures 10 are connected serially with one another is applied.

The semiconductor device is again a customary semiconductor component known to the person skilled in the art, and will therefore not be explained in further detail at this point.

Clearly, any other type of III-V semiconductor material may be used in the semiconductor device according to the invention instead of the GaAs III-V semiconductor substrate 3 mentioned in the illustrative embodiments. The choice of the type of III-V semiconductor material is dependent on the type of functional semiconductor structure that is applied to the substrate. Likewise, it may naturally also be configured as p conductive. The first and the second doped III-V semiconductor layers should then be matched accordingly.

One advantage of conductive III-V semiconductor substrates over semi-insulating substrates is that the crystal growth process is substantially easier to control. That leads to more uniform wafers whose dopant (generally Si) is further distinguished by little diffusion effects.

In addition, the dopants for the pn junction or junctions may advantageously be incorporated into the III-V crystal lattice epitaxially, for example by the utilization of MOVPE or MBE, as a result of which a higher quality in comparison with the substrate (lower impurity concentration, lower dislocation densities, etc.) and therefore a substantially better thermal stability are achieved.

Of course, the invention also provides for the arrangement of different types of functional semiconductor structures 1, for example photodiodes, light-emitting diodes, transistors, MCRW laser diodes, etc., on the same electrically conductive III-V semiconductor substrate 3.

I claim:

1. A semiconductor device, comprising:
    an electrically conductive III-V doped semiconductor substrate having mutually opposite first and second main surfaces and a first conduction type;
    two pn junctions disposed above said first main surface, at least one pn junction of said two pn functions being reverse biased during operation of the semiconductor device;
    at least one functional semiconductor structure disposed above said two pn junctions, said functional semiconductor structure being electrically insulated from said second main surface of said III-V doped semiconductor substrate;
    a first doped III-V semiconductor layer of a second conduction type disposed between said III-V doped semiconductor substrate of said first conduction type and said at least one functional semiconductor structure; and
    a second doped III-V semiconductor layer of said first conduction type disposed between said at least one functional semiconductor structure and said first doped III-V semiconductor layer in such a way that said III-V semiconductor substrate, said first doped III-V semiconductor layer and said second doped III-V semiconductor layer form said two pn junctions, a first pn junction of said two pn junctions being disposed in an opposite direction of a second pn junction of said two pn junctions.

2. The semiconductor device according to claim 1, wherein said electrically conductive III-V doped semiconductor substrate has a charge carrier concentration of more than $1*10^{15}$ cm$^{-3}$ at room temperature.

3. The semiconductor device according to claim 2, wherein said electrically conductive III-V doped semiconductor substrate has a charge carrier concentration of between $1*10^{16}$ cm$^{-3}$ and $1*10^{19}$ cm$^{-3}$ at room temperature.

4. The semiconductor device according to claim 1, wherein said at least one functional semiconductor structure is a metal clad ridge waveguide laser structure.

5. The semiconductor device according to claim 1, wherein said at least one functional semiconductor structure is at least two monolithically integrated functional semiconductor structures, and said at least one pn junction, which is reverse biased during operation of the semiconductor device, is disposed between each of said at least two monolithically integrated functional semiconductor structures and said second main surface of said electrically conductive III-V doped semiconductor substrate.

6. The semiconductor device according to claim 5, wherein said two pn junctions are cut in an intermediate location between two of said at least two monolithically integrated functional semiconductor structures in such a way that there is no conductive electrical connection between said at least two monolithically integrated functional semiconductor structures via said III-V semiconductor substrate and inclusive of at least one of said first doped III-V semiconductor layer and said second doped III-V semiconductor layer.

7. The semiconductor device according to claim 1, wherein said at least one functional semiconductor structure is at least two monolithic integrated functional semiconductor structures of different types.

* * * * *

UNITED STATES PATENT AND TRADEMARK OFFICE
CERTIFICATE OF CORRECTION

PATENT NO. : 6,339,233 B1
DATED : January 15, 2002
INVENTOR(S) : Alfred Lell

It is certified that error appears in the above-identified patent and that said Letters Patent is hereby corrected as shown below:

<u>Title page,</u>
Item [22], should read as follows:

-- Filed: Sep. 29, 1997 --

Signed and Sealed this

Third Day of December, 2002

JAMES E. ROGAN
*Director of the United States Patent and Trademark Office*